United States Patent [19]
Crafts

[11] Patent Number: 5,978,304
[45] Date of Patent: Nov. 2, 1999

[54] HIERARCHICAL, ADAPTABLE-CONFIGURATION DYNAMIC RANDOM ACCESS MEMORY

[75] Inventor: Harold S. Crafts, Colorado Springs, Colo.

[73] Assignee: LSI Logic Corporation, Milpitas, Calif.

[21] Appl. No.: 09/107,874

[22] Filed: Jun. 30, 1998

[51] Int. Cl.[6] ............................................. G11C 8/00
[52] U.S. Cl. .............. 365/230.03; 365/200; 365/230.02; 365/230.06
[58] Field of Search ...................... 365/230.03, 189.02, 365/230.02, 230.06, 200, 189.08

[56] References Cited

U.S. PATENT DOCUMENTS

| | | | |
|---|---|---|---|
| 4,866,676 | 9/1989 | Crisp et al. | 365/200 |
| 5,208,778 | 5/1993 | Kumanoya et al. | 365/201 |
| 5,231,319 | 7/1993 | Crafts et al. | 307/603 |
| 5,270,977 | 12/1993 | Iwamoto et al. | 365/201 |
| 5,323,348 | 6/1994 | Mori et al. | 365/200 |
| 5,325,334 | 6/1994 | Roh et al. | 365/201 |
| 5,373,472 | 12/1994 | Takashi Ohsawa | 365/201 |
| 5,386,386 | 1/1995 | Ogihara | 365/200 |
| 5,388,104 | 2/1995 | Shirotori | 371/21.1 |
| 5,440,517 | 8/1995 | Morgan et al. | 365/202 |
| 5,471,482 | 11/1995 | Byers et al. | 371/21.2 |
| 5,502,675 | 3/1996 | Kohno et al. | 365/200 |
| 5,517,450 | 5/1996 | Ohsawa et al. | 365/200 |
| 5,577,004 | 11/1996 | Leshem | 365/230.03 |
| 5,623,640 | 4/1997 | Nakabo | 395/497.01 |
| 5,689,466 | 11/1997 | Quereshi | 365/201 |
| 5,825,682 | 10/1998 | Fukui | 365/49 |
| 5,896,331 | 4/1999 | Crafts | 365/201 |
| 5,901,095 | 5/1999 | Crafts | 365/200 |

OTHER PUBLICATIONS

"Automatic Small Computer System Interface Termination Circuit for Narrow/Wide Devices on Wide Bus" IBM Technical Disclosure Bulletin. vol. 40, No. 4 Apr. 4, 1997, New York, US, pp. 78–82, XP000728275.

"BI–0316 Mass Storage Module" Dec. 6, 1996, Brand Innovators B. V. XP002071927. Available from Internet <URL:http//www.brandinnovators.com/manual/bi0316/16/book_33.htm>.

*Primary Examiner*—David Nelms
*Assistant Examiner*—Hien Nguyen

[57] ABSTRACT

A DRAM memory array is organized hierarchically into groups of DRAM segments, bit blocks within segments, and memory cells within bit blocks, arranged in rows and columns. A control and logic circuit extends along the rows and columns and segment buses extend from the control and logic circuit to the DRAM segments. Partial decoding of the address and control signals occurs in the control and logic circuit and the partially decoded control and address signals are supplied on the segment buses. Adaptable memory operations are controlled in the control and logic circuit, such as redundant element substitution, data block addressing, multiplexing of the data bit width signals available at the DRAM segments to the width required by a system bus. This flexibility allows various physical organizations of the DRAM array.

23 Claims, 8 Drawing Sheets

HIERARCHICAL, ADAPTABLE-CONFIGURATION DYNAMIC RANDOM ACCESS MEMORY

CROSS-REFERENCE TO RELATED APPLICATION

This invention is related to the following inventions which are described in U.S. patent applications titled "Electrically Selectable Redundant Components for an Embedded DRAM," Ser. No. 08/997,503, filed on Dec. 27, 1997; "DRAM With Built-In Noise Protection," Ser. No. 09/050,674, filed Mar. 30, 1998; "Embedded DRAM with Noise-Protected Differential Capacitor Memory Cells," Ser. No. 09/052,279, filed Mar. 30, 1998; "Reprogrammable Address Selector For An Embedded DRAM," Ser. No. 08/997,242, Filed Dec. 23, 1997; and "Inherently Compensated Clocking Circuit for Dynamic Random Access Memory", Ser. No. (Docket 98-036), filed currently herewith. The inventions of these applications were made by one of the inventors herein and are assigned to the assignee hereof. The disclosures of these applications are incorporated in this application by this reference.

This invention generally relates to dynamic random access memory (DRAM) and is of particular value for DRAM embedded in a system level integrated circuit (SLIC). More particularly, the present invention relates to new and improved hierarchical organization and configuration of DRAM memory components which allows flexible layout to accommodate numerous different space constraints when the DRAM array is embedded in a SLIC. The hierarchical configuration also allows only the desired memory components to be energized selectively to accomplish memory operations, thereby conserving power.

BACKGROUND OF THE INVENTION

A DRAM is a memory element which typically holds and supplies information for use by electronic computing and logic elements, such as microcontrollers, microprocessors, logic arrays, and the like. In a computer system, the DRAM delivers information to, and receives information from, a processor, typically a microprocessor, over electrical conductors of a system bus. The information stored in the DRAM is used by the microprocessor for computation and control.

The typical DRAM comprises thousands of individual memory cells arranged in a matrix-like configuration and control logic for controlling the memory operations. The cells of the matrix are addressed by address signals generated by the microprocessor and supplied on word lines, and by signals sensed or read from, or by signals selectively supplied or written on, selectively-addressed bit lines. The word lines extend along horizontal rows of cells and intersect vertical columns of cells in the matrix. The bit lines extend along vertical columns of cells and intersect horizontal rows of cells in the matrix. In concept, by energizing a selected word line and reading or writing only on selected bit lines, individual cells at the intersections of the selected word and bit lines are written or read. In this manner, unique memory "addresses" represent specific word line and bit line combinations which access the information located at the cells identified by the address. Memory cell control and data address signals are generated by the microprocessor.

Control logic of the memory performs the read and write operations on the DRAM memory cells. The control logic receives control signals from the microprocessor requesting a read or write operation, and receives address signals indicating the memory cell addresses where the read or write operation is to be performed. The control logic then carries out the read or write operation. For a write operation, the microprocessor also provides the data to be stored in the addressed memory cells. For a read operation the data obtained from the addressed DRAM cells is supplied to the microprocessor.

The microprocessor based system may be a general purpose computer system or may be an application-specific integrated circuit (ASIC) or a system-level integrated circuit (SLIC). An ASIC or a SLIC is a single IC which includes a combination of various electronic components, such as microcontrollers, microprocessors, logic gates, registers, amplifiers and the like, all of which have been selected, connected and integrated together to perform specific functions for a specific application. Examples of SLICs are controllers for computer memory disc drives, graphics controllers, LAN switches, fuel injector control systems for internal combustion engines, global positioning systems, and control devices for a wide variety of consumer products, among many other things. SLICs are desirable for use in mass produced products because of the enormous amount of functionality which can be created at a very low effective cost. These types of SLICs are sometimes referred to as a "system on a chip," because of the complete functionality obtained from the single chip or IC.

DRAMs have only recently been incorporated as part of SLICs. Previously, when the SLIC required memory to function, separate memories or DRAM chips were provided on a printed circuit board. Embedding DRAM in a SLIC avoids the additional cost of a separate memory chip. Avoiding the cost of the separate DRAM chip is attractive because separate DRAM chips are relatively costly and of considerable memory size. The embedded DRAM portion of the SLIC usually represents a relatively small portion of the overall size of the typical SLIC. If this were not the case, it would be more cost effective to use a separate DRAM chip in combination with the SLIC.

Typically a SLIC manufacturer will have a "library" of standard component designs which can be incorporated together in creating the SLIC, because of the wide variety of different circuitry which may be required in different SLICs. The standard library designs will include, for example, arrays of logic gates, microprocessors, DRAMs and the like. The cost effectiveness of competing in the SLIC fabrication market depends on the ability to integrate the standard library designs together in creating the SLIC, without specifically having to redesign each component each time it is used in a different SLIC. In the case of a memory, each SLIC may require a different amount of memory. Therefore, to avoid specifically designing a memory for each different SLIC, the memory design should accommodate different sizes without redesign of the memory functional components.

Generally, successfully integrating different standard designs will require the ability to physically reposition the standard components on the chip to accommodate differing customer requirements for the SLIC. The cost of an integrated circuit such as a SLIC is directly dependent upon the amount of area consumed by the circuit elements, and not necessarily related to the complexity or amount of circuitry on the chip. Thus, every effort is made to efficiently use all of the available space on the chip to keep the cost of the SLIC as low as possible.

Laying out or configuring the DRAM array on a SLIC chip may require that the regular rectangular matrix-like array of memory cells be altered to accommodate the irregular areas of available space. The regular repetitive nature of the matrix of memory cells makes the DRAM memory array theoretically attractive to break into portions and distribute the portions in spaces not occupied by other SLIC components. However, even changing the regular, repetitive nature of a DRAM memory configuration may introduce unintended errors. Correcting the errors may add considerable cost to the SLIC.

In addition to the physical constraints of integrating a DRAM memory array into a SLIC, there are many different functional requirements which also must be accommodated among various different SLICs that may be fabricated. For example, in some SLICs of modest functionality, the bit width of words communicated on the system bus may be 8 or 16 bits. On more sophisticated or high-performance systems, the bit width may be 32, 64 or 128 bits. Since the basic memory cell aspects of the DRAM will be the same in all types of systems, additional component features must be incorporated to adapt the standard DRAM memory cells to accommodate a variety of different functional requirements. These additional component features may require additional space to integrate into the SLIC, may increase the number of standard designs in the design library, may increase the cost of fabricating the chip because the cost of the additional designs must be accounted for and because extra space may be consumed by the additional designs, and may increase the risks of design and fabrication errors when the SLIC is fabricated.

It is with respect to these and other considerations relating to creating DRAM memory arrays embedded in SLICs that the present invention has evolved.

SUMMARY OF THE INVENTION

One aspect of the present invention is to improve the physical configuration and layout of a DRAM, especially an embedded DRAM. Another improvement is to facilitate the layout and configuration of different amounts of DRAM in a memory array without requiring component changes in the memory operational components. A further improvement allows the memory array to be configured in a variety of different shapes to accommodate unusual and irregular shaped areas on a SLIC chip while avoiding changes in design of the memory operational components. A further improvement is to reduce the power consumption and to increase the performance of the DRAM memory array. Lastly, should fabrication errors occur, another improvement is to facilitate the substitution of redundant memory elements without disrupting or slowing the testing of the functional aspects of the DRAM memory or the memory operations accomplished in use.

To accomplish these and other improvements, a DRAM of the present invention is formed by an array of rows and columns of DRAM segments. Each DRAM segment includes a plurality of memory cells. A control and logic circuit extends along the rows and columns of DRAM segments. A control and logic circuit includes a row interface and select circuit associated with each row of the array, a column select circuit associated with each column of the array, an interface bus extending to the row interface and select circuit and to the column select circuit, and a controller connecting the interface bus to a system bus of the computer system to distribute signals between the interface and system buses. A segment row address bus extends from each row interface and select circuit to each DRAM segment in the associated row. A segment column address bus extends from each column select circuit to each DRAM segment in the associated column. Each row interface and select circuit includes a partial decoder to partially decode row address signals from the interface bus and supply partially decoded row address signals on the segment row address bus. Each column select circuit includes a partial decoder to partially decode column address signals from the interface bus and supply partially decoded column address signals on the segment column address bus.

By organizing the memory array into DRAM segments, and by partially decoding the address signals into row and column signals transferred on the segment row and column address buses, the physical arrangement of the DRAM segments and the addressing of those segments is readily adapted to many different physical configurations without requiring redesign of the DRAM memory. Furthermore, the partial decoding of the address information allows only selected DRAM segments to be powered, thereby saving power. The partial decoding of the addresses also enhances power distribution by causing a lesser number of signal fluctuations within the segment address buses and reduces the number of conductors carrying address signals. The flexibility in addressing DRAM segments allows redundant segments to be substituted for defective segment by addressing techniques, rather than physical techniques.

Additional preferred aspects of the present invention which also contribute to its improvements include the following. Row and column partial decoders are connected to the segment row and column address buses to respond to the partially decoded row and column address signals and to activate the DRAM segment for memory operations only when the DRAM segment is selected. Segment word and bit address buses also extend from each row interface and select circuit, and word line and bit line decoders supply signals on the segment word and bit address buses to the DRAM segments in the row. A segment data in bus and a segment data out bus also extend from each row interface and select circuit to transfer data from the DRAM segments in the row. In addition, a segment control bus extends from each row interface and select circuit to distribute control signals to the DRAM segments in the row. The distribution of the segment control, row, word and bit address buses from the row interface and select circuit also facilitates the physical placement of the DRAM segments without requiring redesign of the array components.

Additional improvements include forming each DRAM segment as a plurality of bit blocks organized in rows, and forming each bit block with a plurality of rows and columns of memory cells. Organized in this manner, the DRAM segments can be replicated as necessary to obtain the desired amount of memory. Furthermore, the DRAM segments are preferably organized in groups of a plurality of DRAM segments per group, thereby allowing some of the DRAM control circuitry to be shared to further reduce space consumption and facilitate and an efficient but variable organization of the memory array.

Preferably, redundancy is achieved by redundant bit blocks within the DRAM segment, and by at least one redundant DRAM segment per row of DRAM segments within the array. An array multiplexer/demultiplexer may be included in the control and logic circuit to change the bit width of signals supplied on the system bus to the width signals used in the array, to either increase the bit width within the array in the case of a narrower system bus or to decrease the bit width within the array in the case of a wider system bus. Words of bit width greater than or less than the bit width of the system bus are read and written in the DRAM segments by flexibility in addressing information caused by the hierarchical distribution of elements within the memory array and by the flexibility in addressing DRAM segments. A data block generator generates the address signals for the DRAM segments according to the size and amount of words to be written or read in the DRAM segments.

Another preferred improvement is to include a refresh controller in the control and logic circuit. The refresh controller periodically performs a read modify write operation on each DRAM segment within the array on an autonomous basis to maintain the data in the DRAM memory cells.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

DETAILED DESCRIPTION

Figure 1:
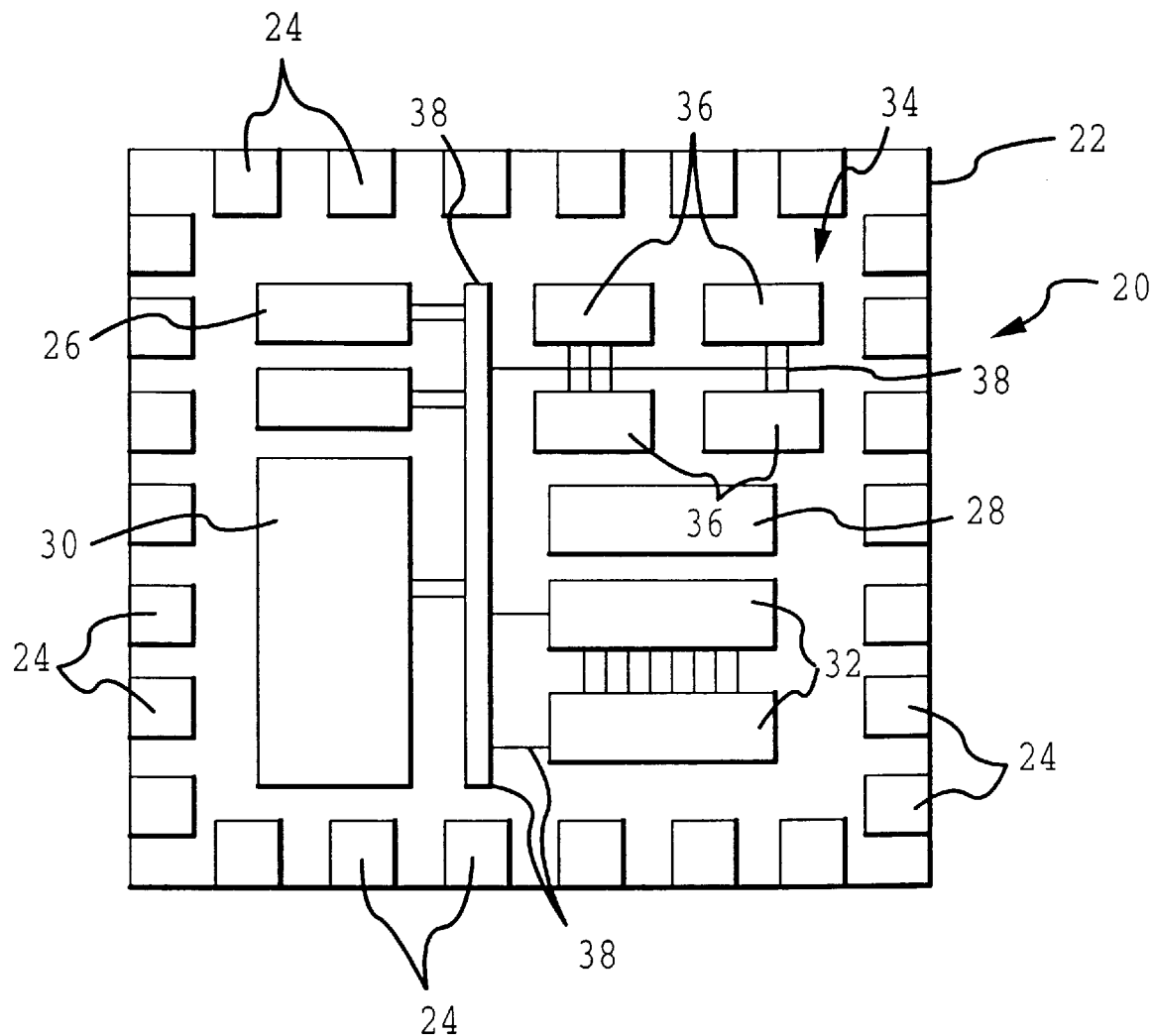
FIG. 1 is an overall layout illustration, not necessarily to scale or in proportion, illustrating a typical SLIC with an embedded DRAM array incorporating the present invention.

A system level integrated circuit (SLIC) 20 which incorporates the present invention is generally shown in illustrative, not-to-scale and not-to-proportion form in FIG. 1. Other than the present invention, the SLIC 20 is conventional. The SLIC 20 is formed as an integral unit on a die or chip 22. Pads 24 are formed on the exterior of the chip 22 by which to connect external electrical conductors (not shown), once the chip 22 has been packaged in a standard IC package (also not shown). The pads 24 are connected by internal conductors to the various functional components of the SLIC 20. The functional components of the SLIC 20 will vary according to the SLIC, but in general those components will include a processor 26, a read only memory (ROM) 28, logic arrays 30, and registers 32, for example, as other well known digital or analog components.

Included in the SLIC 20, or other IC, is an embedded dynamic random access memory (DRAM) array 34 which incorporates the present invention, although the present invention can also be incorporated in DRAM arrays which are not embedded. The embedded DRAM array 34 is connected to the microprocessor 26 by electrical conductors forming a system bus 38 on the chip 22. The system bus 38 is of the standard configuration having a plurality of separate conductors which are generally located parallel to one another and over which control, address and data signals are transmitted between the processor 26 and the DRAM array 34 as well as the various other components 28, 30 and 32, etc. In general, the numbers, types and layout positions of the specific SLIC components on the chip 22 will vary according to each different SLIC, and the size of the DRAM array 34 will also vary according to the type of SLIC chip 22.

Figure 2:
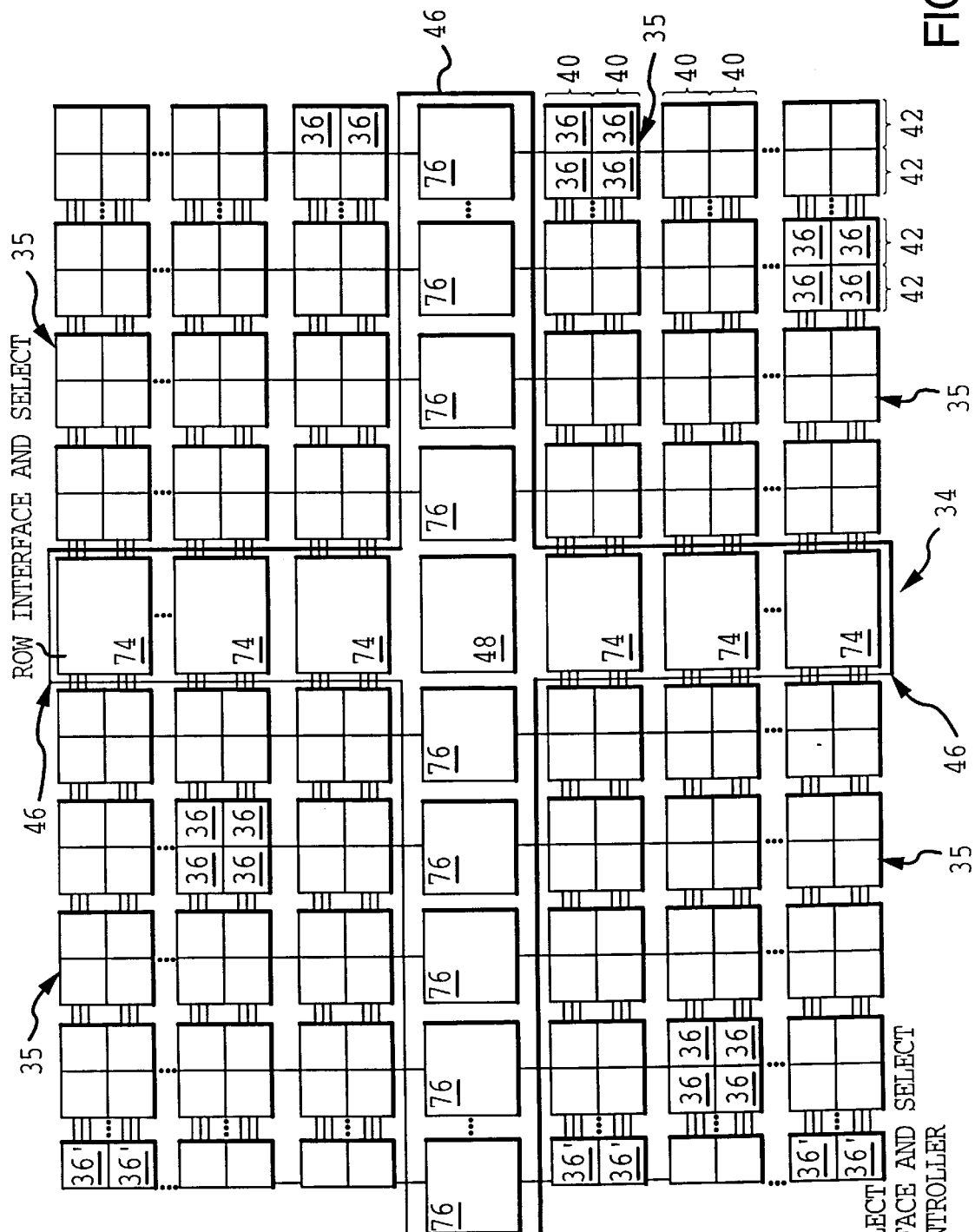
FIG. 2 is a generalized configuration diagram of the DRAM array shown in FIG. 1, illustrating a plurality of DRAM segments and an array control and logic circuit.

The DRAM array 34 comprises a plurality of groups 35 of DRAM segments 36 arranged in a matrix or grid-like configuration which has rows 40 and columns 42 as shown in FIG. 2. For ease in SLIC fabrication, the DRAM segments 36 are designed as separate integral units of a specific memory size, for example, 32K bits arranged in 32-bit words. The segments 36 are combined into the groups 35 with each group 35 having four DRAM segments 36, as shown in FIG. 2. Combining the segments 36 in this manner minimizes space requirement since the segments 36 of each group 35 share certain segment control circuitry as discussed below.

The amount of embedded DRAM in the array 34 is generally established by replicating the number of groups 35 of DRAM segments 36 until the desired memory size or capacity is achieved. The DRAM array 34 represented in FIG. 2 comprises at least 16 columns and 32 rows of segments 36, although not all of the segments 36 are specifically shown. Consequently, the DRAM array 34 has a 16 megabit capacity when 32 kilobit (32K) segments 36 are used. Other DRAM array embodiments may comprise more or less segments depending on the number of segments used as well as the size of each segment 36.

The DRAM array 34 also includes additional segments 36' for redundancy purposes. The redundant segments 36' are substituted for any defective segment 36 in the same row 40. By substituting the redundant segment 36' for a defective segment 36, the functionality of the SLIC and DRAM array is maintained, and the chip 22 need not be discarded. Generally, defects occur as a result of the manufacturing process.

The DRAM segments 36 are connected to and interface with the system bus 38 (FIG. 1) through an array control and logic circuit 46 shown in FIG. 2. The array control and logic circuit 46 is typically located in a vertical space similar to a column near the middle of the columns 42 and in a horizontal space similar to a row near the middle of the rows 40. Centrally locating the array control and logic circuit 46 minimizes the physical distances between the array control and logic circuit 46 and the segments 36. Minimizing the physical distance between the control and logic circuit 46 and the DRAM segments 36 increases performance because signals communicated between the array control and logic circuit 46 and the DRAM segments 36 require less time to travel shorter distances. The length of conductors extending between the array control and logic circuit 46 and the DRAM segments is also decreased, which causes less capacitive loading which typically increases the propagation time of the signals along the conductors.

Although shown in the middle of the DRAM array 34 in FIG. 2, the array control and logic circuit 46 can also be adjusted in position, possibly with some sacrifice in performance depending upon the physical configuration of the DRAM segment groups 35. Furthermore, the number and extent of the rows and columns of DRAM segments 36 may be adjusted to cover an irregular area rather than the regular rectangular pattern shown in FIG. 2. The functionality of the array control and logic circuit allows variable length rows and columns, with variable numbers of DRAM segments 36 in each row and column. As discussed below, the array control and logic circuit 46 may select DRAM segments 36 for reading and writing operations on the basis of supplying or receiving data blocks of information, and the data blocks are not necessarily restricted by the physical position and relationship of the selected DRAM segments in the physical DRAM array 34. In a similar manner, the redundant DRAM segments 36' are substituted in the row for any defective segment 36 by the addressing functionality of the array control and logic circuit 46.

A centrally-located memory controller 48 of the array control and logic circuit 46 contains the data, control and address buffers which interface with the system bus 38 (FIG. 1) as well as memory array control functionality. The memory controller 48 is shown in greater detail in FIG. 3. The memory controller 48 includes an array data buffer 50 which is connected to conductors 54 of the system bus 38 which carry the system data to and from the memory array 34 (FIG. 2). The data-carrying conductors 54 form only a portion of the system bus, in the conventional manner. An array address buffer 56 connects to conductors 58 of the system bus 38 that carry the address signals supplied by the microprocessor 26 (FIG. 1). Of course, the address signals on an address bus portion 58 of the system bus 38 are coordinated with the data signals appearing on the data bus portion 54 of the system bus 38. An array control buffer 60 receives system control signals supplied on conductors 62 which form a control bus portion of the system bus 38. Consequently, the interface of the memory array 34 with the SLIC is through the memory controller 48 of the memory array 34.

The system control signals on the control bus portion 62 of the system bus 38 are received in the array control buffer 60, and constitute input signals to an array controller 64. The array controller 64 performs the supervisory and control functions of the array control and logic circuit 46, as well as the other typical memory control functions. The array controller 64 responds to control signals from the system bus to supply segment control signals on an interface control bus 66. The control signals on the interface control bus 66 are employed by the other elements of the array control and logic circuit 46 to accomplish the functions described below. The interface control signal bus 66 extends throughout the array control and logic circuit 46.

Figure 3:
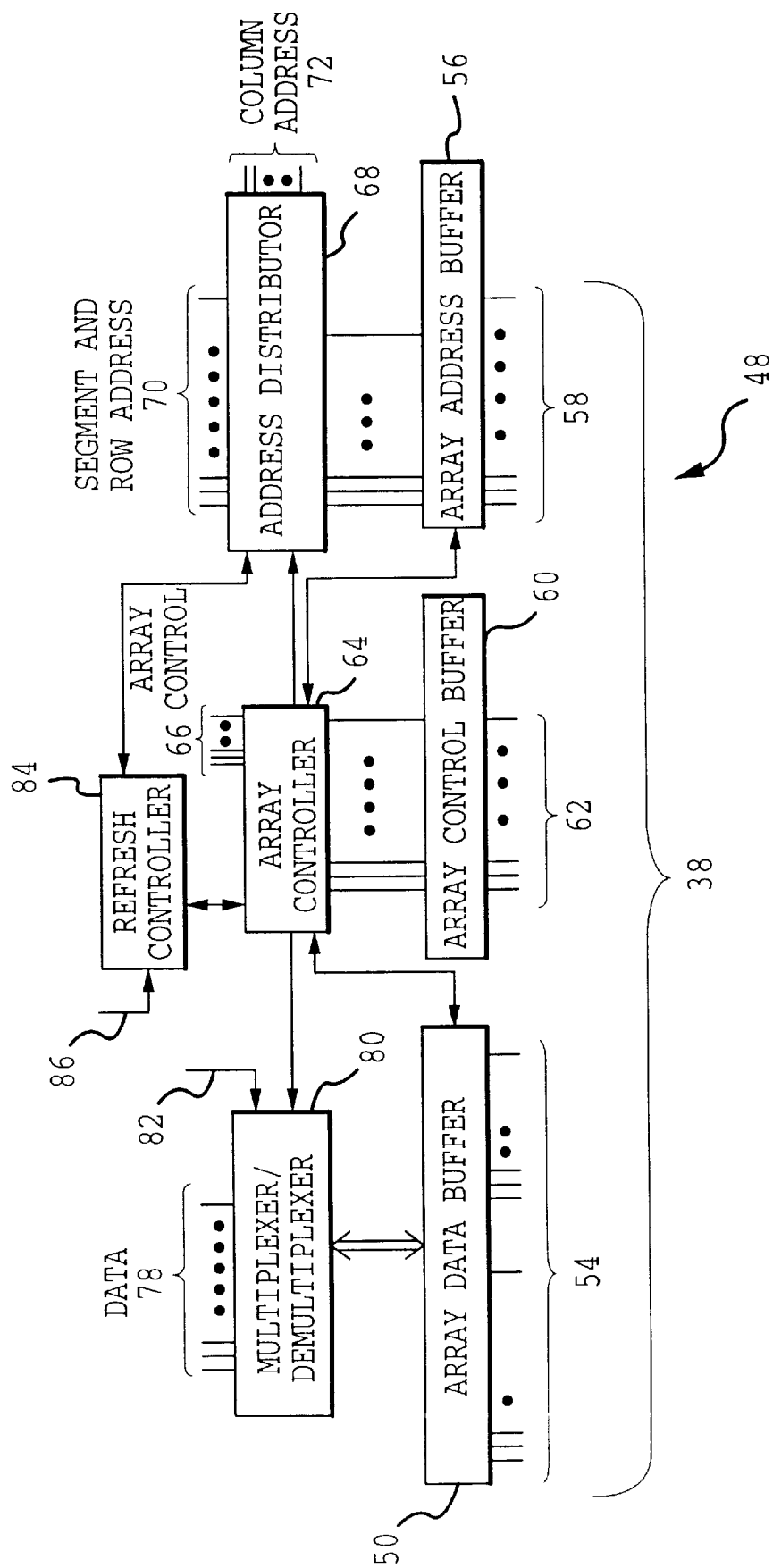
FIG. 3 is a block diagram of an array memory controller of the array control and logic circuit shown in FIG. 2.

The array address buffer 56 supplies the address signals from the address bus portion 58 of the system bus 38 to an address distributor 68, shown in FIG. 3. The address distributor 68 recognizes those portions of the system address signals at 58 and distributes or separates those address signals into row address signals supplied on a row address interface bus 70 and into column address signals supplied on a column address interface bus 72. The row and column address interface buses 70 and 72 are conducted throughout the array control and logic circuit 46 (FIG. 2). The row address interface bus 70 connects to each of a plurality of row interface and select circuits 74 (FIG. 2) in the array control and logic circuit 46. As discussed below, the signals on the row address interface bus 70 are decoded by decoders in the row interface and select circuits 74 to select a row or partial row of segments 36 in the memory array 34 (FIG. 2) for activation. Similarly, the column address interface bus 72 connects to each of a plurality of column select circuits 76 (FIG. 2) in the array control and logic circuit 46. The signals on the column address interface bus 72 are partially decoded by the column select circuits 76 (FIG. 2) to select particular columns of segments 36 in the memory array 34 for activation. The row and column address distribution function of the distributor 68 is controlled by the array controller 64, in response to the array controller receiving a signal from the address buffer 56 that address information from the address bus 58 of the system bus 38 is present in the address buffer 56.

Optionally, the address distributor 68 may be eliminated, and an equal number of interface address bus conductors as the conductors of the address bus 54 portion of the system bus 38 may be extended throughout the array control and logic circuit 46. In such a case, the row interface and select circuit 74 and the column select circuit 76 respond to the signals present on the interface bus conductors. By using the address distributor 68, not all of the conductors corresponding to the address bus portion 58 need be extended throughout the array control and logic circuit 46 (FIG. 2).

Data to be written to the memory array is presented on the data bus 54 portion of the system bus 38 and temporarily stored in the array data buffer 50. Thereafter that data is transferred on an interface data bus 78 to the row interface and select circuits 74 (FIG. 2). The row interface and select circuits 74 transfer the signals from the interface data bus 78 to the DRAM segments 36 for writing. Similarly, data read from the DRAM segments 36 is supplied from the row interface and select circuit 74 to the interface data bus 78 and is temporarily stored in the array data buffer 50 before being transferred on the data bus portion 54 of the system bus 38.

In those cases where the system data bus 54 is wider in bit width than the interface data bus 78, a multiplexer/demultiplexer 80 establishes the correct word width for the information transferred on each bus 54 and 78. The multiplexer/demultiplexer 80 is referred to below for convenience as simply a multiplexer. In the circumstance shown in FIG. 3, the multiplexer 80 separates the bits from the system data bus 54 into two smaller words supplied on the interface data bus 78. For example, if the system data bus 54 is 64 bits wide, the multiplexer 80 will divide the 64 bits into two 32 bit words and supply them on the 32 bit wide interface data bus 78. Similarly, if the interface data bus 78 is 8 bits wide, the multiplexer 80 would divide the 64 bit signals from the data buffer 50 into eight 8 bit words and supply them one at a time on the interface data bus 78. The same process would apply to data supplied from the interface data bus 78 to the array data buffer 50. When the interface data bus 78 is narrower in bit width than the system data bus 54, the multiplexer 80 loads the data buffer 50 with the required number of words from the interface data bus 78 to create a word width sufficient to occupy the entire width of the system data bus 54. The same functionality applies in reverse if the system data bus 54 is narrower in width than the interface data bus 78.

The multiplexer 80 is controlled by the array controller 64 in response to data received from the system data bus 54 and to be written to the DRAM segments. A control signal at 82 is applied to the multiplexer 80 to control loading of the data buffer 50 in response to data read from the DRAM segments and supplied on the interface data bus 78 by the row interface and select circuits 74 (FIG. 2). The control signal 82 therefore originates from each row interface and select circuit (FIG. 2) to control the multiplexer 80 when the data is available on the interface data bus 78.

In those cases where the system data bus 54 has the same bit width as the interface data bus 78, there is no need for the multiplexer 80. In those circumstances, the functionality of the multiplexer 80 is simply that of passing the data between the data buffer 50 and the interface data bus 78.

The multiplexer 80 allows the memory array 34 to be used with a variety of different system data bus bit and word widths without requiring a substantial redesign of the characteristics of the memory array. Consequently, the memory array may be readily adapted into a variety of different SLICs without requiring design changes.

In addition to the controlling memory operations involving the data, address and control signals, the block memory controller 48 also includes a refresh controller 84, as shown in FIG. 3. The refresh controller 84 autonomously performs a refresh function necessary to maintain the data in the DRAM segments 36 (FIG. 2). As is typical for DRAM memory, the electrical charge in the memory cells must be replenished on a periodic basis or otherwise the data will be lost. The typical method of refreshing a DRAM memory is to perform a read modify write function, where the data is not modified. The read modify write function involves reading data from the DRAM segments before the charge has dissipated, temporarily storing the data, and thereafter writing the stored data back to the DRAM memory. By writing the data back, the charge in the memory cells is replenished and the memory is refreshed.

The refresh function is typically performed under the control of the system microprocessor. However, using the system microprocessor to control the refresh function diminishes its ability to perform other functions, and thereby reduces the performance of the computer system or SLIC. The refresh controller 84 periodically performs the refresh function on each DRAM segment 36 (FIG. 2) without the supervision or control of the system microprocessor 26 (FIG. 1). The refresh controller 84 keeps track of the time duration between refresh operations with respect to each DRAM segment 36 and portions of each DRAM segment. A maximum time duration has previously been established between refresh operations based on the charge dissipation characteristics of the memory cells. The refresh controller 84 also keeps track of those memory addresses which have been inherently refreshed as a result of normal data read and write memory operations. Only those memory addresses and DRAM segments which have not been refreshed as a result of the normal read and write operations will be refreshed. Signals from the address distributor 68 are supplied to the refresh controller, along with signals from the array controller 64 so that the information used to establish the refresh locations in the memory array can be established and kept current.

The refresh controller 84 sends signals to the array controller 64 when a refresh operation is to be initiated. The array controller 64 sends appropriate control signals on the interface control bus 66 to the row interface and select circuit 74 (FIG. 2) to perform the read modify write refresh operation. In addition, the refresh controller 84 supplies the address signals of the memory locations to be refreshed to the address distributor 68. The address signals are thereafter distributed on the row address interface bus 70 and column address interface bus 72 to identify those DRAM segments which require refreshing.

The refresh capability of the DRAM array 34 is achieved autonomously by the refresh controller 84, thereby causing the DRAM array to appear to the microprocessor 26 (FIG. 1) as a static random access memory (SRAM). A SRAM need not be periodically refreshed, because its data is stable or static due to the circuitry employed in the SRAM. Causing the DRAM array 34 to appear to the microprocessor as an SRAM offers the advantage of freeing the microprocessor for more computational functions, thereby enhancing the performance of the SLIC or other computer system. The cost of a DRAM is considerably less than the cost of an SRAM. More memory capability is achieved in a DRAM than in an SRAM of the same chip surface area because the DRAM has fewer functional transistors and other elements. Thus, the autonomous refresh controller 84 offers the significant advantage of causing a lower cost and higher memory density DRAM to simulate the performance of a SRAM.

Figure 4:
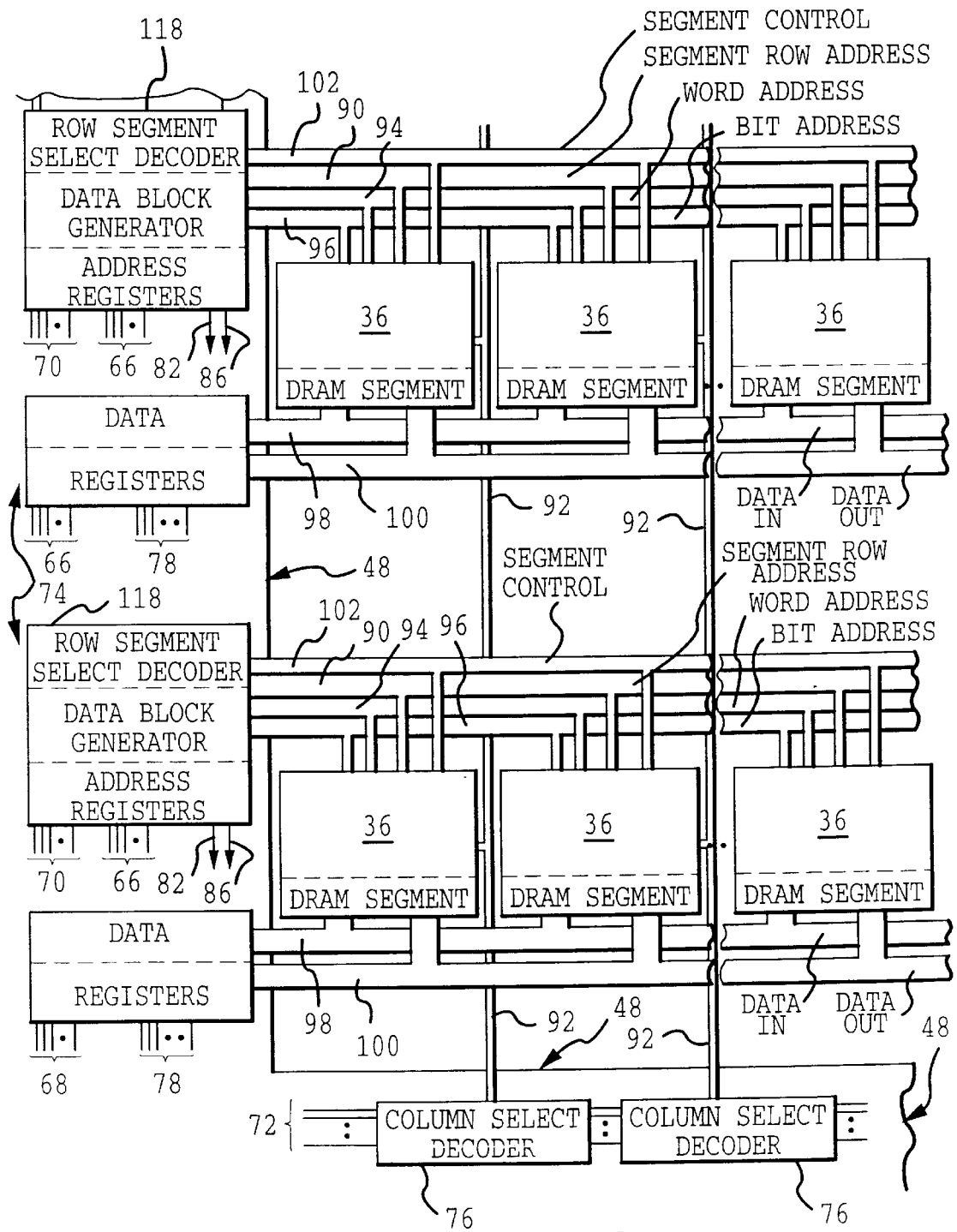
FIG. 4 is a block diagram of portions of a row interface and select circuit of the array control and logic circuit shown in FIG. 2, and of segment control, row address, word address, bit address, data in and data out buses extending between DRAM segments and the control and logic circuit.

The interface control bus 66, the row address interface bus 70 and the interface data bus 78 are connected to the DRAM segments 36 by the row interface and select circuit 74, as shown in FIG. 4. A segment row address bus 90, a segment word address bus 94, a segment bit address bus 96, a segment data-in bus 98, a segment data-out bus 100 and a segment control bus 102 extend from the row interface and select circuit 74 to each segment 36. A segment column address bus 92 extends from the column select circuit 76 to each segment 36. The column address interface bus 72 is connected to the column select circuit 76. The DRAM segments 36 are separately shown in FIG. 4. Each segment 36 recognizes the signals communicated on the buses 90, 92, 94, 96, 98 and 102 and responds to perform either a read, write, refresh or other memory operation.

Figure 5:
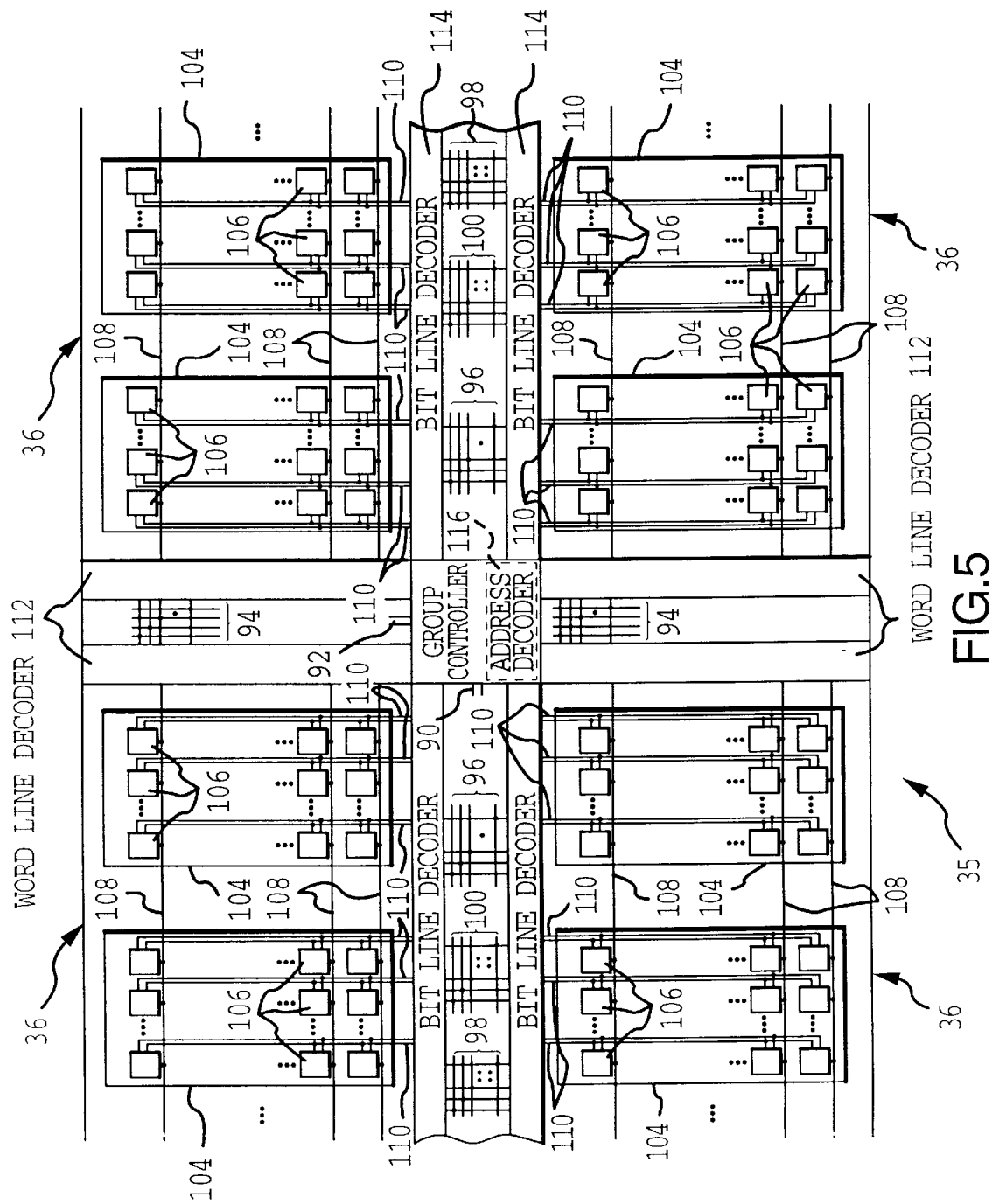
FIG. 5 is an enlarged configuration and functional block diagram of four DRAM segments in a group as used in the array shown in FIG. 2.

Details of each DRAM segment 36 are shown in FIG. 5. Each DRAM segment 36 is formed by a plurality of subparts referred to as bit blocks 104 and each bit block 104 is formed of memory cells 106. The arrangement of the memory cells 106 in the bit blocks 104 and the operating characteristics of this arrangement are discussed more completely in the above-identified U.S. patent application titled "Electrically Selectable Redundant Components For An Embedded DRAM."

The DRAM cells 106 generally have the conventional construction of a matrix-like configuration arranged in horizontal rows and vertical columns in each bit block 104 and in each segment 36. The individual DRAM cells 106 in specific rows within each DRAM segment 36 are interconnected in the conventional manner by word lines 108. Typically, one redundant bit block may be included in each row in the DRAM segment. The individual DRAM cells 106 in the vertical columns within each DRAM segment 36 are interconnected by bit line pairs 110 as disclosed in the above-identified U.S. patent application titled "Embedded DRAM with Noise-Protected Differential Capacitor Memory Cells."

Conventional word line and bit line decoders 112 and 114 of each DRAM segment 36 are connected to the conductors of the segment word address bus 94 and the segment bit address bus 96. The word line and bit line decoders 112 and 114 respond to predetermined address signals supplied on the segment word address bus 94 and the segment bit address bus 96 to energize or activate those specific word line conductors 108 and bit line conductors 110 which correspond to the address signals supplied over the segment address busses 94 and 96. The activated word and bit line conductors 108 and 110 access a memory cell 106 in each of the bit blocks 104 of the DRAM segment 36 at the intersection of the activated word and bit line conductors 108 and 110 to read and write the information. The information is read or written in words having predetermined bit widths, typically determined by the number of bit blocks 104 in each DRAM segment 36. The information which is read from the DRAM segments 36 is conducted over the segment data-out bus 100, and the information which is written to the DRAM segment 36 is applied to the segment data-in bus 98.

Besides the conventional word line and bit line decoders 112 and 114, the DRAM segment 36 also include a segment address decoder 116 which is connected to the conductors of the segment row address bus 90 and segment column address bus 92. The segment address decoder 116 responds to predetermined address signals supplied on the segment row address bus 90 and segment column address bus 92 to energize or activate the word line decoder 112 and the bit line decoder 114 of the addressed DRAM segment.

The row, word and address busses 90, 94 and 96 each conduct partially decoded address signals from the row interface and select circuits 74. As shown in FIG. 4, the row interface and select circuit 74 receives the signals from the row address interface bus 70 and partially decodes the row address signals into the segment address signals supplied on the segment row address bus 90. The segment column address bus 92 conducts partially decoded signals from the column select circuit 76 (FIG. 2), which are supplied in response to the column address signals at 72 (FIG. 3). The partial decoding of the row address signals at 70 and the column address signals that 72 by a row select decoder 118 of the row interface and select circuit 74 (FIG. 4) and by a decoder of the column select circuit 76 (FIG. 2) is shown in greater detail in FIGS. 6 and 7.

Figure 6:
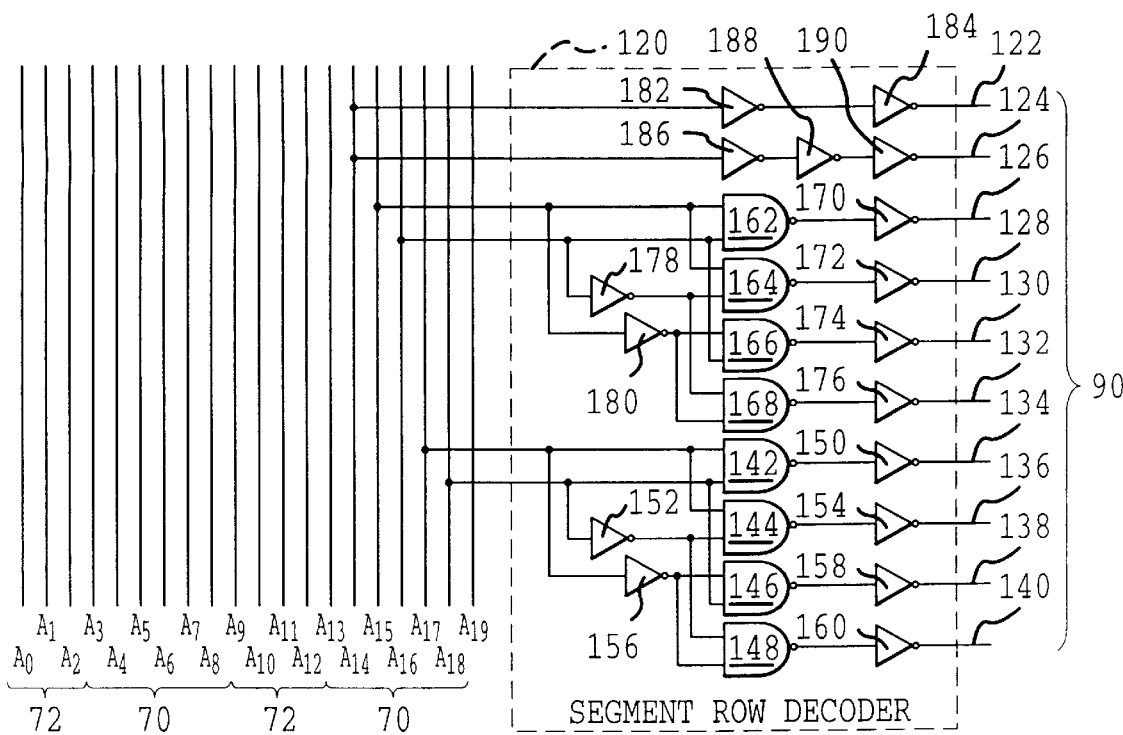
FIG. 6 is a logic circuit diagram of a segment row partial decoder of the array control and logic circuit shown in FIG. 4.
Figure 7:
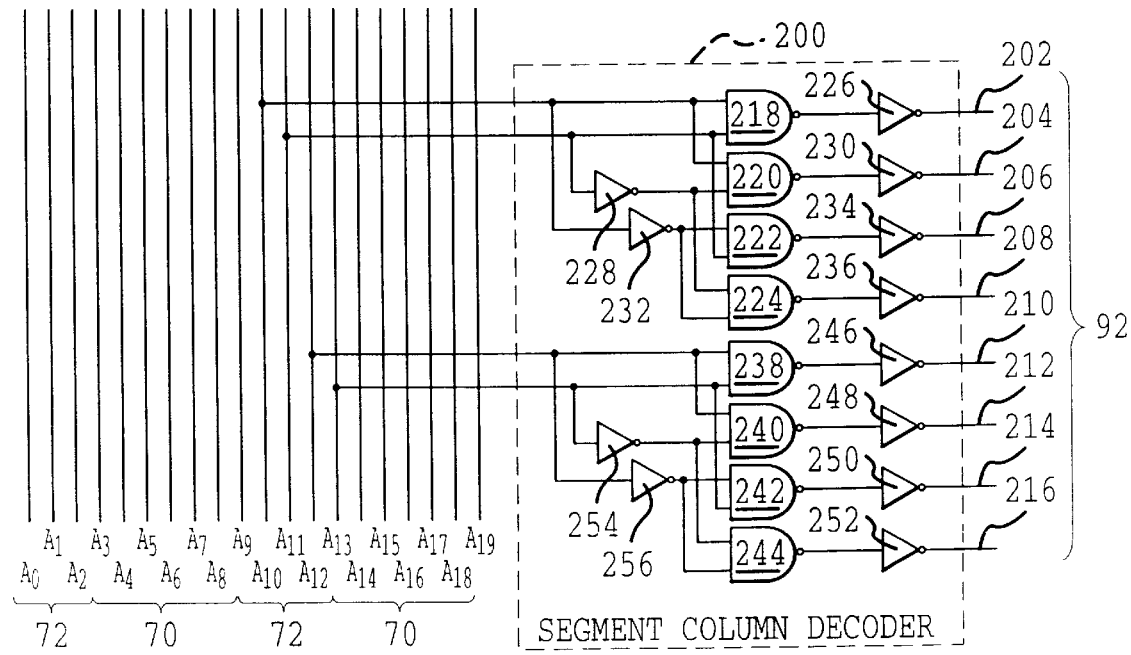
FIG. 7 is a logic circuit diagram of a segment column partial decoder of the array control and logic circuit shown in FIG. 4.

As shown in FIGS. 6 and 7, the signals on the row address interface bus 70 and the column address interface bus 72 are present on conductors A0–A18. The binary address conductors A0–A2 supply bit line address information which is used by the bit line decoders 114 to selectively activate one of a plurality of bit line pairs 110 in each DRAM segment 36 (FIG. 5). The binary address conductors A3–A9 supply word line address information which is used by the word line decoders 112 to selectively activate one of the word lines 108 in each DRAM segment 36 (FIG. 5). The binary address conductors A10–A13 are used to conduct segment column address information to the column select circuit 76 (FIG. 2), and the conductors A14–A18 conduct segment row address information to the row interface and select circuits 74 (FIG. 4). The segment row and segment column address information (A10–A18) is used to activate the desired segment 36 while the word line and bit line address information (A0–A9) is used to activate the desired memory cells 106 within the addressed segment 36.

The row segment select decoder 118 of the row interface and select circuit 74 employs the segment row partial decoder circuit 120 shown in FIG. 6 to decode the address signals A14–A18 into control signals that are delivered to the DRAM segments 36 on the conductors 122, 124, 126, 128, 130, 132, 134, 136, 138 and 140. For a given row address, only three of the conductors 122, 124, 126, 128, 130, 132, 134, 136, 138 and 140 conduct activating control signals while the others conduct non-activating control signals or conduct no signals. The row and column address decoder 116 (FIG. 5) of each segment 36 in particular row is selectively connected to one of the two conductors 122 and 124, to one of the four conductors 126, 128, 130 and 132 and to one of the four conductors 134, 136, 138 and 140. Moreover, each DRAM segment 36 in a particular row is selectively connected to the same unique three conductors of the group of conductors 122, 124, 126, 128, 130, 132, 134, 136, 138 and 140. Consequently for any given combination of address signals on the address conductors A14–A18, only one row of DRAM segments 36 receives control signals which cause activation and power-up of those segments in that row. Therefore, only one row of segments 36 may be turned on at a time, thereby saving power because the entire DRAM array 34 is not energized simultaneously.

The segment row partial decoder 120 shown in FIG. 6 comprises four NAND gates 142, 144, 146 and 148. The input terminals of the NAND gate 142 are connected to and receive signals from the address lines A17 and A18. The output terminal of the NAND gate 142 is connected to the input terminal of an inverter 150, and an output terminal of the inverter 150 is connected to the conductor 134 of the segment row address bus 90 (FIG. 4). The NAND gate 142 conducts a low signal to the inverter 150 when the signals at A17 and A18 are both at high levels, and the NAND gate 142 delivers a high level signal to the inverter 150 when either of the signals at A17 and A18 is low. The inverter 150 logically inverts the signal received from the NAND gate 142. Thus the inverter 150 delivers a high signal on the conductor 134 when the NAND gate 142 conducts a low signal, and conducts a low signal, if at all, when the NAND gate 142 conducts a high logic signal.

One input terminal of the NAND gate 146 is connected to and receives a signal from the address line A17. The other input terminal of the NAND gate 146 is connected to the output terminal of an inverter 152. The input terminal of the inverter 152 is connected to and receives a signal from the address line A18. The output terminal of the NAND gate 144 is connected to the input terminal of the inverter 154, and the output terminal of the inverter 154 is connected to the conductor 136 of the segment row address bus 90 (FIG. 4). The NAND gate 144 conducts a low signal to the inverter 154 when the signals on address lines A17 and A18 are high and low, respectively. Otherwise the NAND gate 144 conducts a high signal to the inverter 154. The inverter 154 thus operates to conduct a high signal on the address line 136 only when the signals at A17 and A18 are high and low, respectively.

Similarly, one input terminal of the NAND gate 146 is connected to and receives a voltage signal from the address line A18. The other input terminal of the NAND gate 146 is connected to the output terminal of an inverter 156. The input terminal of the inverter 156 is connected to and receives a signal from the address line A17. The output terminal of the NAND gate 146 is connected to the input terminal of the inverter 158, and the output terminal of the inverter 158 is connected to the conductor 138 of the segment row address bus 90 (FIG. 4). The NAND gate 146 conducts a low signal to the inverter 158 when the voltage signals located on address lines A17 and A18 are low and high, respectively. Otherwise the NAND gate 148 conducts a high voltage signal to the inverter 158. The inverter 158 thus operates to conduct a high voltage signal on the address line 138 only when the signals at A17 and A18 are low and high, respectively.

The input terminals of the NAND gate 148 are each connected to the output terminals of the inverters 152 and 156. The output terminal of the NAND gate 148 is connected to the input terminal of the inverter 160, and the output terminal of the inverter 160 is connected to the conductor 140 of the segment row address bus 90 (FIG. 4). The NAND gate 148 conducts a low signal to the inverter 160 when the signals located on address lines A17 and A18 are both low. Otherwise the NAND gate 148 conducts a high voltage signal to the inverter 160. The inverter 160 thus operates to conduct a high signal on the address line 140 only when the signals at A17 and A18 are both low.

The segment row partial decode circuit 120 decodes the address lines A15 and A16 in the same manner using four NAND gates 162, 164, 166 and 168, and six inverters 170, 172, 174, 176, 178 and 180 to place a high signal on one of the four address lines 126, 128, 130 and 132 in response to signals on the address lines A15 and A16. The address line 126 conducts a high signal when both address lines A15 and A16 conduct high signals. The address line 128 conducts a high signal when the address lines A15 and A16 conduct high and low signals. The address line 130 conducts a high signal when the address lines A15 and A16 conduct low and high signals. The address line 132 conducts a high signal when both the address lines A15 and A16 conduct low signals. The signals applied on the conductors 126, 128, 130 and 132 appear on segment address bus 90 shown in FIG. 4.

The segment row partial decode circuit 120 decodes the address line A14 using the inverters 182, 184, 186, 188 and 190. Essentially, the address line 122 conducts a high signal when the address line A14 conducts a high signal and a low signal when the address line A14 conducts a low signal. Conversely, the address line 124 conducts a high signal when the address line A14 conducts a low signal and a low signal when the address line A14 conducts a high voltage signal. The use of the inverters in this manner achieves a buffering function. Inverters are faster in transferring the signals than other types of buffers.

The address lines 122, 124, 126, 128, 130, 132, 134, 136, 138 and 140 (FIG. 6) form the segment row address bus 90 (FIG. 4) and communicate signals to the DRAM segments 36. However, each DRAM segment 36 receives signals from only three of the address lines 122, 124, 126, 128, 130, 132, 134, 136, 138 and 140. Each segment receives signals from one of the address lines 122 and 124, from one of the address lines 126, 128, 130 and 132, and from one of the address lines 134, 136, 138 and 140. The three signals are then further decoded within each segment by the segment address decoder 116 so that one and only one row 40 is activated for each combination of addresses appearing on the address lines A14–A18.

By connecting only three address lines (three of the signals at 122, 124, 126, 128, 130, 132, 134, 136, 138, 140) to each of the segments 36, each DRAM segment must decode only three signals as compared to decoding all five of the address signals A14–A18. Reducing the number of signals that must be decoded also reduces the number of logic gates in each segment 36 dedicated to decoding these address signals. Reducing the number of decoding logic gates saves space in each segment 36. Additionally, reducing the number of signals reduces the power consumption of each segment since less decoding is done in the segment 36. Reducing the number of signals also smooths power conducted and reduces the influences of voltage and current transitions within the memory array.

The partial decoding occurring in the row interface and select circuit (FIG. 4) and the complete decoding in the segment address decoder 116 also reduces spurious noise spikes caused by large changes in current in very short amounts of time (di/dt) because the maximum number of conductors that experience current changes on the address lines is three as compared to five. Additionally, the average power consumed by the bus is relatively constant since at all times three voltage signals are delivered on the address lines 122, 124, 126, 128, 130, 132, 134, 136, 138 and 140.

An alternative of the segment row partial decoder circuit 120 could be configured using these same principles to further decode the signals on A14–A18 and deliver fewer than three signals, e.g., two signals. Further decoding requires the use of more conductors on the segment row address bus 90. For example, if only two conductors on the segment row address bus 90 delivered activating signals, the segment row address bus would need twelve conductors as compared to the ten conductors illustrated in FIG. 6. Additional decoding in this manner further reduces the power consumption of the segment row address bus 90 because the number of signals is reduced from three to two. Moreover, this reduction conserves power on the bus 90 as compared with a DRAM having no partial decoding. The average number of signals on a segment row address bus having no partial decoding is approximately two and a half for the five address lines A14–A18, but the average number of signals on the segment row address bus 90 having partial decoding is two for the same five address lines A14–A18.

The column select circuit 76 (FIG. 7) contains partial decoder circuitry 200 that partially decodes the column address signals A10–A13 into control signals that are delivered to the segments 36 on the conductors 202, 204, 206, 208, 210, 212, 214 and 216, which form the segment column address bus 92. For a given column address, only two of the conductors 202, 204, 206, 208, 210, 212, 214 and 216 conduct activating control signals while the others conduct non-activating signals or do not conduct at all. Each segment 36 in a particular column is selectively connected to one of the four conductors 202, 204, 206 and 208 and one of the four conductors 210, 212, 214 and 216. Moreover, each segment 36 in a particular column is selectively connected to the same unique two conductors of the group of conductors 202, 204, 206, 208, 210, 212, 214 and 216. Consequently for any given combination of address signals on the address conductors A10–A13, only one column of conductors receives control signals which cause activation of the DRAM segments in the column.

The column select decode logic 200 comprises four NAND gates 218, 220, 222 and 224. The input terminals of the NAND gate 218 are connected to and receive signals from the address lines A10 and A11. The output terminal of the NAND gate 218 is connected to the input terminal of the inverter 226, while the output terminal of the inverter 226 is connected to the conductor 202 of the segment column address bus 62. The NAND gate 218 conducts a low signal to the inverter 226 when the signals at A10 and A11 are both high logic signals and delivers a high signal to the inverter 226 when either of the signals at A10 and A11 are low. The inverter 226 logically inverts the signal received from the NAND gate 218. Thus the inverter 226 delivers a high logic signal on the conductor 202 when the NAND gate 238 conducts a low signal and conducts a low signal, if at all, when the NAND gate 218 conducts a high signal.

One input terminal of the NAND gate 220 is connected to and receives a signal from the address line A10. The other input terminal of the NAND gate 220 is connected to the output terminal of an inverter 228. The input terminal of the inverter 228 is connected to and receives a signal from the address line A11. The output terminal of the NAND gate 220 is connected to the input terminal of the inverter 230, while the output terminal of the inverter 230 is connected to the conductor 204 of the segment column address bus 62. The NAND gate 220 conducts a low signal to the inverter 230 when the signals located on address lines A10 and A11 are high and low, respectively. Otherwise the NAND gate 220 conducts a high signal to the inverter 230. The inverter 230 thus operates to conduct a high signal on the address line 204 only when the signals at A10 and A11 are high and low, respectively.

Similarly, one input terminal of the NAND gate 222 is connected to and receives a voltage signal from the address line A11. The other input terminal of the NAND gate 222 is connected to the output terminal of an inverter 232. The input terminal of the inverter 232 is connected to and receives a signal from the address line A10. The output terminal of the NAND gate 222 is connected to the input terminal of the inverter 234, while the output terminal of the inverter 234 is connected to the conductor 206 of the segment column address bus 92. The NAND gate 222 conducts a low signal to the inverter 234 when the signals located on address lines A10 and A11 are low and high, respectively. Otherwise the NAND gate 222 conducts a high signal to the inverter 234. The inverter 234 thus operates to conduct a high signal on the address line 206 only when the signals at A10 and A11 are low and high, respectively.

The input terminals of the NAND gate 224 are each connected to the output terminals of the inverters 228 and 232. The output terminal of the NAND gate 224 is connected to the input terminal of the inverter 236, while the output terminal of the inverter 236 is connected to the conductor 208 of the segment column address bus 92. The NAND gate 224 conducts a low signal to the inverter 236 when the signals located on address lines A10 and A11 are both low. Otherwise the NAND gate 224 conducts a high signal to the inverter 236. The inverter 236 thus operates to conduct a high signal on the address line 208 only when the signals at A10 and A11 are both low.

The segment column partial decoder circuit 200 decodes the address lines A12 and A13 in the same manner using four NAND gates 238, 240, 242 and 244 and six inverters 246, 248, 250, 252, 254 and 256 to place a high signal on one of the four address lines 210, 212, 214 and 216 in response to signals on the address lines A12 and A13. The address line 210 conducts a high signal when both address lines A12 and A13 conduct high signals. The address line 212 conducts a high signal when the address lines A12 and A13 conduct high and low signals, respectively. The address line 214 conducts a high signal when the address lines A12 and A13 conduct low and high signals, respectively. The address line 216 conducts a high signal when both the address lines A12 and A13 conduct low signals.

The address lines 202, 204, 206, 208, 210, 212, 214 and 216 form the segment column address bus 92 (FIG. 4) and communicate signals to the memory segments 36. However, each segment 36 receives signals from only two of the address lines 202, 204, 206, 208, 210, 212, 214 and 216. Each segment receives signals from one of the address lines 202, 204, 206 and 208 and one of the address lines 210, 212, 214 and 216. The two signals are then further decoded within each DRAM segment 36 by the segment address decoder 116 (FIG. 5) so that one and only one column 42 (FIG. 2) is activated for each combination of addresses appearing on the address lines A10–A13.

Figure 8:
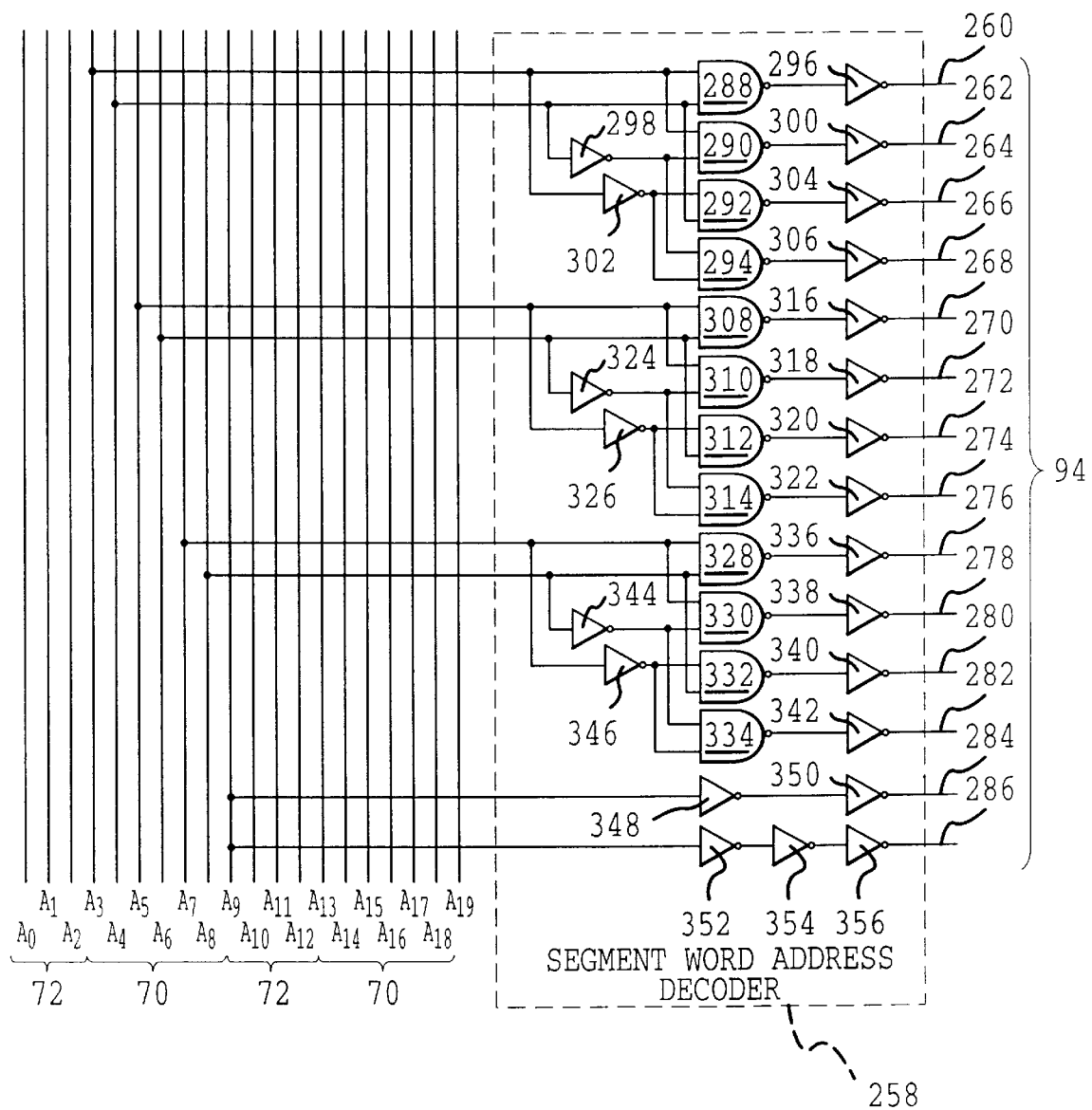
FIG. 8 is a logic circuit diagram of a segment word partial decoder of the array control and logic circuit shown in FIG. 4.

The control and logic circuit 46 also includes a segment word address partial decoder circuit 258 shown in FIG. 8 that partially decodes the word address signals A3–A9 into signals that are delivered to the segments 36 on the conductors 260, 262, 264, 266, 268, 270, 272, 274, 276, 278, 280, 282, 284 and 286. These conductors form the segment word address bus 94. For a given segment word address, only four of the conductors 260, 262, 264, 266, 268, 270, 272, 274, 276, 278, 280, 282, 284 and 286, conduct an activating signal while the others conduct non-activating signals or do not conduct at all. Each word line 108 (FIG. 5) of each DRAM segment is selectively connected to one of the four conductors 260, 262, 264 and 266, one of the four conductors 268, 270, 272 and 274, one of the four conductors 276, 278, 280 and 282 and one of the two conductors 284 and 286. Consequently for any given combination of address signals on the address conductors A3–A9, only one word line in each segment 36 is enabled.

The segment word address partial decoder circuit 258 comprises four NAND gates 288, 290, 292 and 294. The input terminals of the NAND gate 288 are connected to and receive signals from the address lines A3 and A4. The output terminal of the NAND gate 288 is connected to the input terminal of an inverter 296, while the output terminal of the inverter 296 is connected to the conductor 260 of the word line address bus 94. The NAND gate 288 conducts a low signal to the inverter 296 when the signals at A3 and A4 are both high logic signals and delivers a high signal to the inverter 296 when either of the signals at A3 and A4 is low. The inverter 296 logically inverts the signal received from the NAND gate 288. Thus the inverter 296 delivers a high signal on the conductor 260 when the NAND gate 288 conducts a low signal and conducts a low signal, if at all, when the NAND gate 288 conducts a high signal.

One input terminal of the NAND gate 290 is connected to and receives a signal from the address line A3. The other input terminal of the NAND gate 290 is connected to the output terminal of an inverter 298. The input terminal of the inverter 298 is connected to and receives a signal from the address line A4. The output terminal of the NAND gate 290 is connected to the input terminal of the inverter 300, while the output terminal of the inverter 300 is connected to the conductor 262 of the segment word address bus 94. The NAND gate 290 conducts a low signal to the inverter 300 when the signals on address lines A3 and A4 are high and low, respectively. Otherwise the NAND gate 290 conducts a high signal to the inverter 300. The inverter 300 thus operates to conduct a high signal on the address line 262 only when the signals at A3 and A4 are high and low, respectively.

Similarly, one input terminal of the NAND gate 292 is connected to and receives a voltage signal from the address line A4. The other input terminal of the NAND gate 292 is connected to the output terminal of an inverter 302. The input terminal of the inverter 302 is connected to and receives a signal from the address line A3. The output terminal of the NAND gate 292 is connected to the input terminal of an inverter 304, while the output terminal of the inverter 304 is connected to the conductor 264 of the segment word address bus 94. The NAND gate 292 conducts a low signal to the inverter 304 when the signals located on address lines A3 and A4 are low and high, respectively. Otherwise the NAND gate 292 conducts a high signal to the inverter 304. The inverter 304 thus operates to conduct a high signal on the address line 264 only when the signals at A3 and A4 are low and high, respectively.

The input terminals of the NAND gate 294 are each connected to the output terminals of the inverters 298 and 302. The output terminal of the NAND gate 294 is connected to the input terminal of an inverter 306, while the output terminal of the inverter 306 is connected to the conductor 266 of the segment word address bus 94. The NAND gate 294 conducts a low signal to the inverter 306 when the signals located on address lines A3 and A4 are both low. Otherwise the NAND gate 294 conducts a high signal to the inverter 306. The inverter 306 thus operates to conduct a high signal on the address line 266 only when the signals at A3 and A4 are both low.

The segment word address partial decoder circuit 258 decodes the address lines A5 and A6 in the same manner using four NAND gates 308, 310, 312 and 314 and six inverters 316, 318, 320, 322, 324 and 326 to place a high signal on one of the four address lines 268, 270, 272 and 274 in response to signals on the address lines A5 and A6. The address line 268 conducts a high signal when both address lines A5 and A6 conduct high signals. The address line 270 conducts a high signal when the address lines A5 and A6 conduct high and low signals, respectively. The address line 272 conducts a high voltage signal when the address lines A5 and A6 conduct low and high signals, respectively. The address line 274 conducts a high signal when both the address lines A5 and A6 conduct low signals.

The segment word address partial decoder circuit 258 also decodes the address lines A7 and A8 in the same manner using four NAND gates 328, 330, 332 and 334 and six inverters 336, 338, 340, 342, 344 and 346 to place a high signal on one of the four address conductors 276, 278, 280 and 282 in response to signals on the address lines A7 and A8. The address line 276 conducts a high signal when both address lines A7 and A8 conduct high signals. The address line 278 conducts a high signal when the address lines A7 and A8 conduct high and low signals, respectively. The address line 280 conducts a high signal when the address lines A7 and A8 conduct low and high signals, respectively. The address line 282 conducts a high signal when both the address lines A7 and A8 conduct low signals.

The segment word address partial decoder circuit 258 decodes the address line A9 using the inverters 348, 350, 352, 354 and 356. Essentially, the address conductor 284 conducts a high signal when the address line A9 conducts a high signal and a low signal when the address line A9 conducts a low signal. Conversely, the address connector 286 conducts a high signal when the address line A9 conducts a low signal and a low signal when the address line A9 conducts a high signal.

The conductors 260, 262, 264, 266, 268, 270, 272, 274, 276, 278, 280, 282, 284 and 286 form the segment word address bus 94 (FIG. 4) and communicate signals to the memory segments 36. However, each word line decoder 112 essentially receives signals from four of the conductors 260, 262, 264, 266, 268, 270, 272, 274, 276, 278, 280, 282, 284 and 286. The word line decoder 112 further decodes the four signals so that one and only word line 108 (FIG. 5) is activated for each combination of addresses appearing on the address lines A3–A9.

Figure 9:
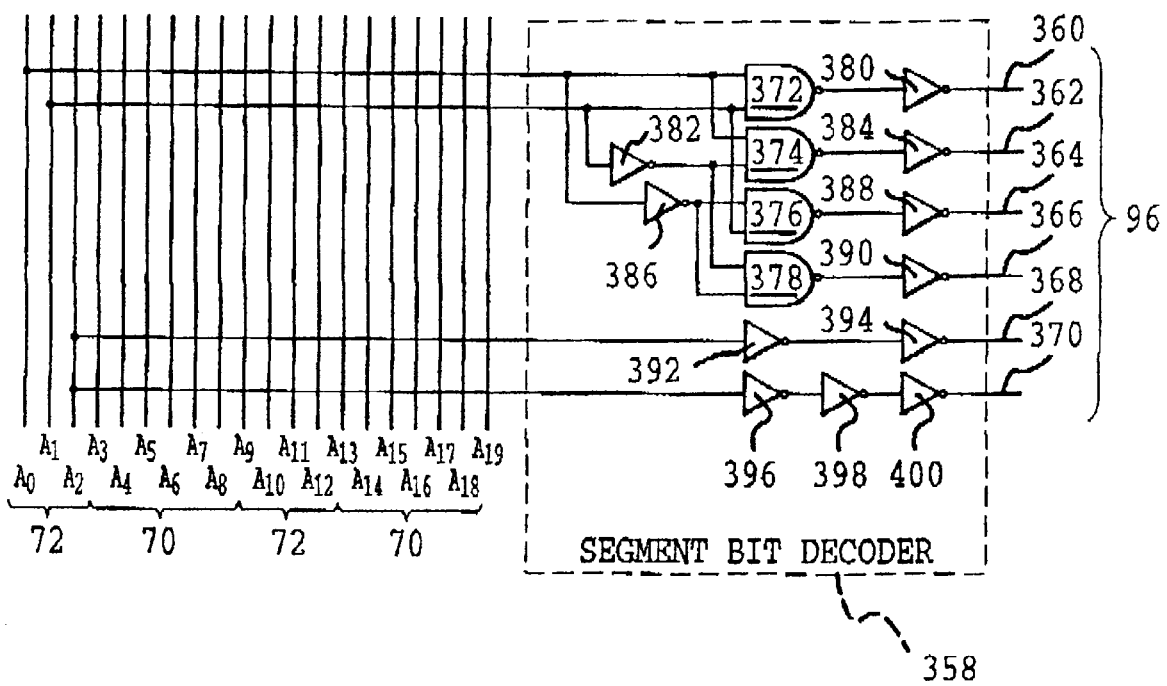
FIG. 9 is a logic circuit diagram of a segment bit line partial decoder of the array control and logic circuit shown in FIG. 4.

The control and logic circuit 46 also contains a segment bit decoder circuit logic 358 shown in FIG. 9 that partially decodes the bit address signals A0–A2 into signals that are delivered to the segments 36 on the conductors 360, 362, 364, 366, 368 and 370. These conductors form the segment bit address bus 96. For a given bit address, only two of the conductors 360, 362, 364, 366, 368 and 370 conduct activating signals while the others conduct non-activating signals or do not conduct at all. Each bit line decoder 114 (FIG. 5) of each segment 36 is selectively connected to one of the four conductors 360, 362, 364 and 366 and one of the two conductors 368 and 370. Consequently for any given combination of address signals on the address lines A0–A2, only bit line decoder 114 (FIG. 5) in each segment 36 receives signals enabling activation.

The segment bit address decoder circuit 358 comprises four NAND gates 372, 374, 376 and 378. The input terminals of the NAND gate 372 are connected to and receive signals from the address lines A0 and A1. The output terminal of the NAND gate 372 is connected to the input terminal of an inverter 380, while the output terminal of the inverter 380 is connected to the conductor 360 of the segment bit address bus 96. The NAND gate 372 conducts a low signal to the inverter 380 when the signals at A0 and A1 are both high signals and delivers a high signal to the inverter 380 when either of the signals at A0 and A1 is low. The inverter 380 logically inverts the signal received from the NAND gate 372. Thus the inverter 380 delivers a high signal on the conductor 360 when the NAND gate 372 conducts a low signal and conducts a low voltage signal, if at all, when the NAND gate 372 conducts a high signal.

One input terminal of the NAND gate 374 is connected to and receives a signal from the address line A0. The other input terminal of the NAND gate 374 is connected to the output terminal of an inverter 382. The input terminal of the inverter 382 is connected to and receives a signal from the address line A1. The output terminal of the NAND gate 374 is connected to the input terminal of the inverter 384, while the output terminal of the inverter 384 is connected to the conductor 362 of the segment bit address bus 96. The NAND gate 374 conducts a low signal to the inverter 384 when the signals located on address lines A0 and A1 are high and low, respectively. Otherwise the NAND gate 374 conducts a high signal to the inverter 384. The inverter 384 thus operates to conduct a high signal on the address line 362 only when the signals at A0 and A1 are high and low, respectively.

Similarly, one input terminal of the NAND gate 376 is connected to and receives a signal from the address line A1. The other input terminal of the NAND gate 376 is connected to the output terminal of an inverter 386. The input terminal of the inverter 386 is connected to and receives a signal from the address line A0. The output terminal of the NAND gate 376 is connected to the input terminal of an inverter 388, while the output terminal of the inverter 388 is connected to the conductor 364 of the segment bit address bus 96. The NAND gate 376 conducts a low signal to the inverter 388 when the signals located on address lines A0 and A1 are low and high, respectively. Otherwise the NAND gate 376 conducts a high signal to the inverter 388. The inverter 388 thus operates to conduct a high signal on the address line 364 only when the signals at A0 and A1 are low and high, respectively.

The input terminals of the NAND gate 378 are each connected to the output terminals of the inverters 382 and 386. The output terminal of the NAND gate 378 is connected to the input terminal of an inverter 390, while the output terminal of the inverter 390 is connected to the conductor 366 of the bit address bus 96. The NAND gate 378 conducts a low signal to the inverter 390 when the signals located on address lines A0 and A1 are both low. Otherwise the NAND gate 378 conducts a high signal to the inverter 390. The inverter 390 thus operates to conduct a high signal on the address line 366 only when the signals at A0 and A1 are both low.

The bit select decode logic 358 decodes the address line A2 using the inverters 392, 394, 396, 398 and 400. Essentially, the address line 368 conducts a high signal when the address line A2 conducts a high signal and a low signal when the address line A2 conducts a low signal. Conversely, the address line 370 conducts a high signal when the address line A2 conducts a low signal and a low signal when the address line A2 conducts a high signal.

The conductors 360, 362, 364, 366, 368 and 370 form the bit address bus 96 (FIG. 4) and communicate signals to the memory segments 36. However, each bit line decoder 114 (FIG. 5) essentially receives signals from two of the conductors 360, 362, 364, 366, 368 and 370. The two signals are further decoded within each DRAM segment 36 by the bit line decoder 114 (FIG. 5) so that one and only bit line pair 110 is activated for each combination of addresses appearing on the address lines A0–A2.

The hierarchical divisions of the DRAM memory array 34 into the groups 35, DRAM segments 36, bit blocks 104 and memory cells 106 allow the array to be physically implemented in a desired sizes by relatively straightforward replication. Because of the divisions into the groups, segments, bit blocks and cells the connections to the memory array are also replicated. The singular control and logic circuit with the replicated row interface and select circuits and the column select circuits also contribute to the relative ease of replication since these circuits need not be redesigned for changed to accommodate different physical configurations of the memory array. Furthermore, the hierarchical nature of the DRAM array allows redundant elements to be substituted for faulty elements with relative ease. The ability to address DRAM segments in data blocks and the multiplexer/demultiplexer to allows different word bit widths to be accommodated by a single memory array, again without redesigning the basic components of the hierarchical array. Many other improvements and advantages will be understood after the invention is fully appreciated.

Presently preferred embodiments of the invention and its improvements have been described with a degree of particularity. This description has been made by way of preferred example. It should be understood that the scope of the present invention is defined by the following claims, and should not necessarily be limited by the detailed description of the preferred embodiment set forth above.

The invention claimed is:

1. A dynamic random access memory (DRAM) for use in a computer system having a system bus, said DRAM comprising:
   a plurality of DRAM segments organized in an array having rows and columns, each DRAM segment including a plurality of memory cells;
   a control and logic circuit extending along the rows and columns of the array, the control and logic circuit including:
      a row interface and select circuit associated with each row of the array,
      a column select circuit associated with each column of the array,
      an interface bus connecting the row interface and select circuit and the column select circuit, and
      a memory controller connecting the interface bus to the system bus to distribute signals therebetween;
   a segment row address bus extending from each row interface and select circuit to each DRAM segment in the associated row;
   a segment column address bus extending from each column select circuit to each DRAM segment in the associated column; and wherein:
   each row interface and select circuit includes a partial decoder to partially decode row address signals from the interface bus and supply partially decoded row address signals on the segment row address bus; and
   each column select circuit includes a partial decoder to partially decode column address signals from the interface bus and supply partially decoded column address signals on the segment column address bus.

2. A DRAM as defined in claim 1 wherein:
   each DRAM segment further includes a row and column partial decoder connected to the segment row address bus and to the segment column address bus to respond to the partially decoded row address signals and column address signals, the row and column partial decoder activating the DRAM segment for memory operations upon the partially decoded row and column address signals selecting the DRAM segment.

3. A DRAM as defined in claim 2 further comprising:
   a segment word address bus and a segment bit address bus extending from each row interface and select circuit to each DRAM segment in the associated row; and
   each DRAM segment further includes a word line decoder and a bit line decoder responsive to signals on the segment word address bus and the segment bit address bus, respectively, when the DRAM segment is activated by the row and column partial decoder.

4. A DRAM as defined in claim 3 further comprising:
   a segment data in bus and a segment data out bus extending from each row interface and select circuit to each DRAM segment in the associated row; and wherein:
   the row interface and select circuit connects the interface bus to the segment data in bus and the segment data out bus;
   the word line decoder of each DRAM segment activates memory cells from selected rows within each DRAM segment in response to the signals on the segment word address bus;
   the bit line decoder of each DRAM segment activates memory cells from selected columns within each DRAM segment in response to the signals on the segment bit address bus, the memory cells from the selected columns being connected to one of the data in or data out buses.

5. A DRAM as defined in claim 4 further comprising:
   a segment control bus extending from each row interface and select circuit to each DRAM segment in the associated row; and wherein:
   the row interface and select circuit distributes control signals from the interface bus to the segment control bus; and
   each DRAM segment includes a control circuit connected and responsive to control signals on segment control bus to control memory operations of the DRAM segment in response to the control signals.

6. A DRAM as defined in claim 5 wherein:
   the control circuit of each DRAM segment connects the memory cells in the selected rows and columns to the data in bus in response to write memory operation signals on the segment control bus and to the data out bus in response to read memory operation signals on the segment control bus.

7. A DRAM as defined in claim 5 wherein:
   each DRAM segment comprises a plurality of bit blocks organized in rows, each bit block having a plurality of rows of memory cells and a plurality of columns of memory cells; and
   each bit block conducts a single bit signal in response to a memory operation.

8. A DRAM as defined in claim 7 wherein:
   each DRAM segment further includes at least one redundant bit block which may be selectively substituted for a defective bit block within a row of bit blocks within the DRAM segment.

9. A DRAM as defined in claim 5 wherein the array is formed by groups of DRAM segments, each group including a plurality of DRAM segments, and wherein:

the segment row address bus and the segment column address bus extend to each group of DRAM segments; and the partial row and column decoder associated with each DRAM segment is common to each DRAM segment within the group.

10. A DRAM as defined in claim 9 wherein:

each group of DRAM segments includes a group controller to which the segment control bus is connected; and the group controller constitutes a common control circuit for all of the DRAM segments of the group.

11. A DRAM as defined in claim 10 wherein:

each DRAM segment of the group comprises a plurality of bit blocks organized in rows, each bit block having a plurality of rows of memory cells and a plurality of columns of memory cells; and each bit block conducts a single bit signal in response to a memory operation.

12. A DRAM as defined in claim 11 wherein:

each DRAM segment further includes at least one redundant bit block which may be selectively substituted for a defective bit block within a row of bit blocks within the DRAM segment.

13. A DRAM as defined in claim 9 wherein:

the groups of DRAM segments are organized in the array in rows and columns of groups; and each row of groups of DRAM segments further includes at least one redundant DRAM segment which may be selectively substituted for a defective DRAM segment within each row of DRAM segments within the groups.

14. A DRAM as defined in claim 5 wherein:

the array further includes at least one redundant DRAM segment which may be selectively substituted for a defective DRAM segment within a row of the DRAM segments within the array.

15. A DRAM as defined in claim 5 wherein each row interface and select circuit further comprises:

a data in register connected to the segment data in bus and to the interface bus, the data in register transferring data between the segment data in bus and the interface bus; and a data out register connected to the segment data out bus and to the interface bus, the data out register transferring data between the segment data out bus and the interface bus.

16. A DRAM as defined in claim 5 wherein the control and logic circuit further comprises:

an array data buffer connected to the system bus to communicate data signals with the system bus;

an array multiplexer/demultiplexer connected between the array data buffer and the interface bus, the multiplexer/demultiplexer loading the array data buffer with data signals obtained in response to a plurality of DRAM segment memory read operations, and the multiplexer/demultiplexer separately supplying a predetermined portion less than all of the data signals from the array data buffer on the interface bus in response to each of a plurality of DRAM segment memory write operations; and the system bus has a data signal bit width greater than a data signal bit width of the interface bus.

17. A DRAM as defined in claim 16 wherein the control and logic circuit further comprises:

an array controller connected to the system bus and operative to supply array control signals on the interface bus in response to read and write signals and data signals on the system bus; and wherein:

the array controller supplies control signals indicative of a plurality of one of read or write memory operations to be performed at one or more selected DRAM segments;

the row interface and select circuit responds to control signals on the interface bus to supply memory operation control signals on the segment control bus;

the DRAM segment selected for each read or write memory operation conducts data signals on the segment data in bus or segment data out bus for each memory operation;

the row interface and select circuit conducts the data signals on the segment data in bus or segment data out bus to the interface bus.

18. A DRAM as defined in claim 5 wherein the control and logic circuit further comprises:

an array data buffer connected to the system bus to communicate data signals with the system bus;

an array multiplexer/demultiplexer connected between the array data buffer and the interface bus, the multiplexer/demultiplexer loading the array data buffer separately a plurality of times with a predetermined portion less than all of the data signals on the interface bus in response to a DRAM segment memory read operation;

the multiplexer/demultiplexer separately supplying a single group of a plurality of data signals obtained separately from the array data buffer in response to a DRAM segment memory write operation; and the system bus has a data signal bit width less than a data signal bit width of the interface bus.

19. A DRAM as defined in claim 18 wherein the control and logic circuit further comprises:

an array controller connected to the system bus and operative to supply array control signals on the interface bus in response to read and write signals and data signals on the system bus; and wherein the array controller supplies control signals indicative of a singular read or write operation to be performed based on a plurality of data signals conducted on the system data bus;

the row interface and select circuit responds to control signals on the interface bus to supply memory operation control signals on the segment control bus;

the DRAM segment selected for each read or write memory operation conducts data signals on the segment data in bus or segment data out bus for each memory operation;

the row interface and select circuit conducts the data signals on the segment data in bus or segment data out bus to the interface bus.

20. A DRAM as defined in claim 5 wherein:

the control and logic circuit further comprises an array controller connected to the system bus and operative to supply array control signals on the interface bus in response to read and write signals and data signals on the system bus; and the row interface and select circuit further comprises a data block generator responsive to address signals on the interface bus to supply a plurality of address signals on the segment row address bus, segment word address bus and segment bit address bus in response to a single address signal on the interface bus; and wherein the selected DRAM segments conduct data signals on the data in bus and the data out bus in response to the plurality of address signals by the data block generator.

21. A DRAM as defined in claim 5 wherein:

the control and logic circuit further comprises a refresh controller for periodically performing a read modify write operation on each DRAM segment within the array on an autonomous basis without signals from the system bus.

22. A DRAM as defined in claim 5 further comprising: wherein:

the DRAM segments are located in the rows on opposite sides of the control and logic circuit; and the DRAM segments are located in the columns on opposite sides of the control and logic circuit.

23. A DRAM as defined in claim 5 wherein each row interface and select circuit further comprises:

an address register connected to the segment row address bus, the segment word address bus and the segment bit address bus and to the interface bus, the address register transferring address signals from the interface bus to the segment row, word and bit address buses.

* * * * *